United States Patent
Wu et al.

(10) Patent No.: US 7,151,315 B2
(45) Date of Patent: Dec. 19, 2006

(54) METHOD OF A NON-METAL BARRIER COPPER DAMASCENE INTEGRATION

(75) Inventors: Zhen-Cheng Wu, Hsin-Chu (TW);
Yung-Chen Lu, Hsin-Chu (TW);
Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/459,222

(22) Filed: Jun. 11, 2003

(65) Prior Publication Data

US 2004/0251547 A1   Dec. 16, 2004

(51) Int. Cl.
*H01L 23/50* (2006.01)
(52) U.S. Cl. .................. 257/751; 257/758; 257/767; 257/E23.145
(58) Field of Classification Search ............... 257/750, 257/751, 761, 763, 764, 758, E23.145, 767, 257/E23.011, E23.144; 438/652, 653
See application file for complete search history.

(56) References Cited

U.S. PATENT DOCUMENTS

| | | | |
|---|---|---|---|
| 4,860,067 A | 8/1989 | Jackson et al. | |
| 5,523,163 A | 6/1996 | Ballance et al. | |
| 5,605,867 A | 2/1997 | Sato et al. | |
| 5,759,906 A | 6/1998 | Lou | |
| 5,858,869 A | 1/1999 | Chen et al. | |
| 5,880,108 A | 3/1999 | Morales et al. | |
| 6,061,000 A | 5/2000 | Edwards | |
| 6,124,198 A | 9/2000 | Moslehi | |
| 6,159,871 A | 12/2000 | Loboda et al. | |
| 6,333,560 B1 | 12/2001 | Uzoh | |
| 6,436,824 B1 | 8/2002 | Chooi et al. | |
| 6,492,262 B1 | 12/2002 | Uzoh | |
| 6,518,184 B1 | 2/2003 | Chambers et al. | |
| 6,525,428 B1 | 2/2003 | Ngo et al. | |
| 6,566,258 B1 | 5/2003 | Dixit et al. | |
| 6,693,046 B1 * | 2/2004 | Takigawa et al. | ........... 438/761 |
| 6,770,570 B1 | 8/2004 | Li et al. | |
| 6,774,489 B1 * | 8/2004 | Russell et al. | ............... 257/752 |

(Continued)

OTHER PUBLICATIONS

"A High Reliability Copper Dual-Damascene Interconnection with Direct-Contact Via Structure", Suzuki et al., ULSI Device Development Division, NEC Electron Devices, NEC Corporation, 1120 Shimokuzawa Sagamihara, 229-1198, Japan, pp. 11.5.1-11.5.4.

(Continued)

*Primary Examiner*—Kenneth Parker
*Assistant Examiner*—Matthew C. Landau
(74) *Attorney, Agent, or Firm*—Hayes and Boone, LLP

(57) ABSTRACT

The present disclosure provides a method, integrated circuit, and interconnect structure utilizing non-metal barrier copper damascene integration. The method is provided for fabricating an interconnect for connecting to one or more front end of line (FEOL) devices. The method includes forming a layer of doped oxide on the one or more FEOL devices and forming a first barrier layer on the layer of doped oxide, the first barrier layer comprising such material as silicon oxycarbide (SiOC) or silicon carbonitride (SiCN). The method further includes forming a plurality of refractory metal plugs in the first barrier layer and the doped oxide layer, forming a low dielectric constant film over the first barrier layer and the plurality of refractory metal plugs, and performing a first etch to create trenches through the low dielectric constant film. The plurality of refractory metal plugs and the first barrier layer perform as an etch-stop.

8 Claims, 6 Drawing Sheets

U.S. PATENT DOCUMENTS

| | | | |
|---|---|---|---|
| 2002/0011673 A1 | 1/2002 | Uzoh | |
| 2002/0042193 A1* | 4/2002 | Noguchi et al. | 438/618 |
| 2002/0140101 A1* | 10/2002 | Yang et al. | 257/762 |
| 2003/0183939 A1* | 10/2003 | Kakamu et al. | 257/762 |
| 2004/0097099 A1* | 5/2004 | Li et al. | 438/766 |

OTHER PUBLICATIONS

"From PVD to CVD to ALD for Interconnects and Related Applications", Rossnagel, S.M., et al., IBM Research, P.O Box 218, Yorktown Heights, NY 10598, pp. 3-5.

"Electrical Reliability Issues of Integrating Thin Ta and TaN Barriers with CU and Low-K Dielectic", Wu, et al., Journal of Electrochemical Society, Apr. 19, 1999, pp. 2-9.

Wu, Z.C., et al., "Advanced Metal Barrier Free Cu Damascene Interconnects with PECVD Silicon Carbide Barriers for 90/65-nm BEOL Technology", Electron Devices Meeting, IEDM '02, pp. 585-598.

* cited by examiner

METHOD OF A NON-METAL BARRIER COPPER DAMASCENE INTEGRATION

BACKGROUND

The present disclosure relates generally to the field of semiconductor processing, and more specifically to a new method of interconnect metallization for devices with relatively small feature sizes. Semiconductor device geometries continue to dramatically decrease in size since such devices were first introduced several decades ago. Since then, integrated circuits have generally followed the two year/half-size rule (often called Moore's Law), which means that the number of devices on a chip doubles every two years. Today's fabrication plants are routinely producing devices having geometries of 0.1 μm and even 90 nm feature sizes and smaller. As device geometries shrink, the interconnect resistance-capacitance (RC) time constant can increase unless design, process, and material changes are implemented to reduce the interconnect RC time constant delay. Solving the problems associated with new process implementations and equipment technology as well as device requirements have become increasingly challenging.

Metallization of integrated circuits can employ a process known as damascene, in which a substrate is inlaid with metal. Damascene and a related process known as dual damascene (both referred to henceforth as "damascene") have become widely used in integrated circuit manufacturing for devices with geometries of 0.1 micron or less. Generally, the damascene process involves creating interconnect schemes by cutting trenches into a dielectric, and then filling those trenches with metal. Any excess metal is then polished away. Damascene methods often use copper as the bulk filling interconnect metal because of its low resistance. A copper interconnect is frequently covered with a metal barrier. Beyond 0.1 micron, however, the low resistance advantage of copper interconnects is diminished by the high resistance metal barrier around the copper interconnect. The metal barrier can cause a significant increase in the total RC time delay which causes device performance to degrade. Attempts to thin the metal barrier can result in reliability concerns, such as line-to-line leakage, time dependent dielectric breakdown (TDDB) lifetime, and bias-temperature stress (BTS).

As the metal barrier thickness decreases to 90 nm or less, the methods for depositing the metal barrier on the substrate also become less effective. Barrier layers are typically deposited by physical vapor deposition (PVD), however as the thickness decreases to 10 nm, potential step coverage and void formation can occur. Chemical vapor deposition (CVD) or atomic layer deposition (ALD) can provide improved step coverage over PVD, but often cannot provide high film purity or metal precursor penetration, especially when employed in conjunction with porous, low dielectric constant (k) materials. CVD or ALD deposited barriers also generally require post-treatment to drive out excess carbon from the deposited film in order to reduce the film's resistance. The metal oxide CVD (MOCVD) precursors contain significant amounts of carbon that become part of the film as the deposition reaction occurs within the vicinity of the substrate. Post treatment of the excess carbon can be an insitu plasma densification in which the barrier film may be formed into a dense stack of plasma densified metal layers.

Another problem associated with metal interconnects is poor reliability under a stressed environment. Reliability can degrade due to electromigration, in which a hydrostatic stress is placed on the interconnects, such as an applied current that induces atomic diffusion as momentum is transferred from flowing electrons to interconnect atoms. Electromigration can lead to shorts and cracks in and between interconnects, vias and trenches.

SUMMARY

A technical advance is achieved by a new and improved method, integrated circuit, and interconnect structure utilizing non-metal barrier copper damascene integration. In one embodiment, a method is provided for fabricating an interconnect for connecting to one or more front end of line (FEOL) devices. The method includes forming a layer of doped oxide on the one or more FEOL devices and forming a first barrier layer on the layer of doped oxide, the first barrier layer comprising such material as silicon oxycarbide (SiOC) or silicon carbonitride (SiCN). The method further includes forming a plurality of refractory metal plugs in the first barrier layer and the doped oxide layer, forming a low dielectric constant film over the first barrier layer and the plurality of refractory metal plugs, and performing a first etch to create trenches through the low dielectric constant film. In some embodiments, the plurality of refractory metal plugs and the first barrier layer perform as an etch-stop.

In some embodiments, the method further includes depositing a second barrier film over the trenches and the low dielectric constant film and depositing copper into the trenches. The copper can be deposited, for example, by using a damascene process.

In some embodiments, the first barrier layer has a barrier material thickness greater than 400 Å and is formed using plasma enhanced chemical vapor deposition.

In another embodiment, an improved integrated circuit is provided. The integrated circuit includes one or more FEOL devices and a layer of doped oxide overlying the devices. A plurality of refractory metal plugs are provided in the doped oxide layer and a first barrier layer of silicon oxycarbide (SiOC) overlies the layer of doped oxide and the plurality of refractory metal plugs. The SiOC layer can have a thickness of approximately 400–600 Å. A low dielectric constant film overlies the first barrier layer and the low dielectric constant film and the first barrier layer include a plurality of trenches etched there-through.

In some embodiments, the integrated circuit also includes a second barrier film over the trenches and the low dielectric constant film. Copper is filled into the trenches, such as through a damascene process. In some embodiments, the second barrier film is one of either SiC, SiOC, or SiCN, and can have a thickness between approximately 100 and 300 Angstroms.

In another embodiment, an improved interconnect is provided. The improved interconnect is for electrically connecting one or more front end of line devices to other structures of an integrated circuit. The interconnect includes a layer of doped oxide overlying at least one of the one or more front end of line devices, a refractory metal plug in the doped oxide layer, and a first barrier layer overlying the layer of doped oxide and the refractory metal plug. The first barrier layer includes silicon and carbon, and has a thickness greater than 400 Å. The interconnect further includes a low dielectric constant film overlying the first barrier layer. The low dielectric constant film and the first barrier layer include a via, which can be filled with copper.

DETAILED DESCRIPTION

The present invention provides a method for improving device performance for various processing technologies such as 0.1 micron complementary metal oxide semiconductor (CMOS) technology, on a semiconductor substrate. In one example, a new method of forming a copper diffusion barrier and dielectric layer uses metal barrier free (MBF) copper damascene and dual damascene interconnect metallization schemes. It is understood, however, that this specific example is only provided to teach the broader inventive concept, and one of ordinary skill in the art can easily apply the teachings of the present disclosure to other semiconductor devices and structures. Also, it is understood that the method discussed in the present disclosure includes and/or utilizes many conventional processes and structures in a new and unique manner.

Figure 1A:
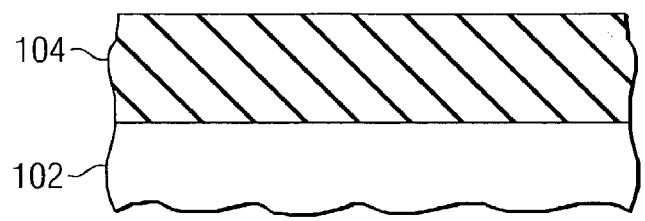
FIGS. 1a–1g are cross-sectional views of a copper damascene metallization method using one embodiment of the present invention.

Referring now to FIG. 1a, in one embodiment, a fabrication method to create MBF copper damascene interconnects can begin with a one or more front end of line (FEOL) devices 102, which can include basic MOSFETs and/or other integrated circuits. These devices 102 are covered with a phosphosilicate glass (PSG) layer 104. The PSG 104 layer may also be another type of doped oxide, such as borophosphosilicate glass (BPSG) that can reduce sodium or other contaminates from penetrating down to the FEOL devices 102 and can provide global planarization over the FEOL devices. The PSG or BPSG layer 104 can be formed by chemical vapor deposition (CVD), plasma enhanced chemical vapor deposition (PECVD), atomic layer deposition (ALD), or any other method that is known by one who is skilled in the art.

Figure 1B:
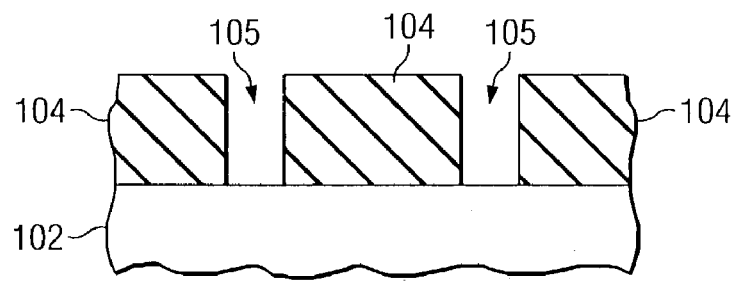

Referring now to FIG. 1b, one or more trenches 105 can be created in the PSG layer 104 by a plasma etch or another fabrication method known to those skilled in the art. The trenches 105 can be lined with a metal barrier. A metal barrier can be comprised of a refractory metal such as Ti, TiN, Ta, TaN, or other appropriate barriers.

Figure 1C:
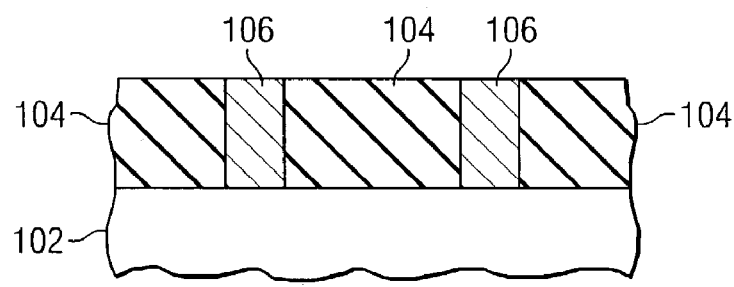

Referring now to FIG. 1c, the trenches 105 can be filled with a refractory metal film forming refractory metal plugs 106, such as tungsten plugs.

Figure 1D:
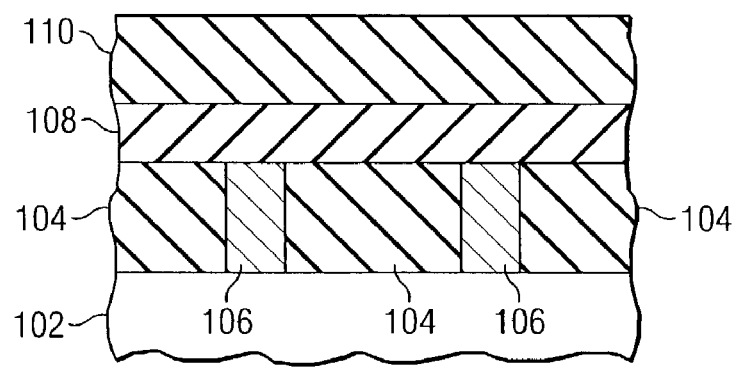

Referring now to FIG. 1d, a non-metal barrier layer 108 comprising a barrier material such as SiOC, SiC or SiCN can be deposited upon the PSG layer 104 and the refractory metal plugs 106. The non-metal barrier layer 108 may be formed by CVD, ALD, PECVD, or any other method that is known to those skilled in the art. SiOC, SiC and SiCN belong to a family of materials which have been found to be good non-metal barriers and inter-layer dielectrics due to their low dielectric constant and ability to prevent metal diffusion. Additionally, some metal and oxygen containing compounds may have suitable barrier properties, and may be used as the non-metal barrier layer 108. The non-metal barrier layer 108 deposition process may be implemented in a variety of process equipment reactors. The processing equipment can be performed in a cluster tool provided by equipment manufacturers such as Applied Materials, Inc. or Novellus Systems, Inc. Where, for example, the non-metal barrier layer 108 is chosen to be SiOC, the layer may be deposited in an ambient environment of 1 to 3 torr at a temperature of 350° C. to 400° C. Reactant gases and liquid precursor vapor may be injected into the process reactor to enable SiOC film growth and formation. The reactant gases may consist of He and/or $CO_2$, and the precursor can be an organosilane precursor vapor. The organosilane precursor vapor can be injected into the process reactor by many methods of injection such as liquid mass flow control, direct liquid injection, bubbling, or any other method that is known by one who is skilled in the art. The typical thickness of SiOC as the non-metal barrier layer 108 may be about 400 Angstroms.

Still referring to FIG. 1d, a low dielectric constant (LK) film 110 can then be deposited over the non-metal barrier layer 108. The LK film 110 can be a porous material with encapsulated vacuum bubbles or other low-k containing components in the film. The LK film 110 can be deposited by a spin-on application, CVD, ALD, PECVD, PVD, or any other method that is known by one who is skilled in the art. The LK film 110 can receive an anti-reflective coating (ARC). The LK film 110 can then be deposited with a patterned photoresist layer in preparation for the etching required to form interconnects for a forthcoming damascene metallization process.

Figure 1E:
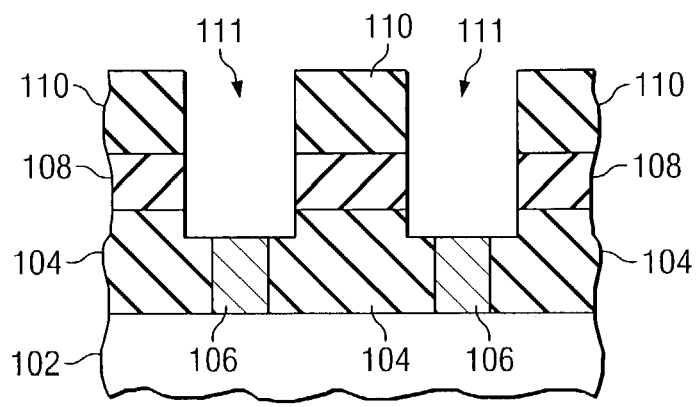

Referring now to FIG. 1e, the LK film 110 is then etched down through to the interface of the non-metal barrier layer 108 and the LK film 110. The etch can further proceed through the non-metal barrier layer 108 to the refractory metal plugs 106, creating trenches 111. The etch process can utilize a dry or plasma etch where reactant ions are accelerated towards the substrate with anisotropic velocity distributions to form vertical profiles through the LK film 110 and the non-metal barrier layer 108.

Figure 1F:
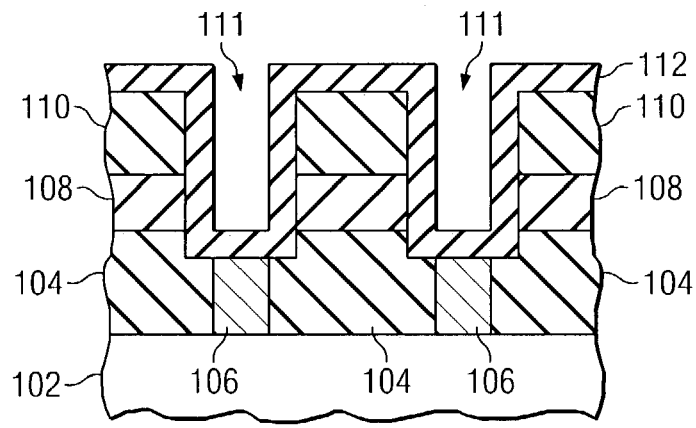

Referring now to FIG. 1f, the surface of the trenches 111 and the LK film 110 can receive a deposition of a non-metal film 112. The non-metal film 112 can be, for example, SiOC, SiC or SiCN. Additionally, some metal and oxygen containing compounds may have suitable barrier properties, and may be used as the non-metal film 112. Where SiC is chosen as the non-metal film 112, the SiC can be deposited by CVD, ALD, PECVD, PVD, or any other method that is known by one who is skilled in the art. The SiC film can be formed by using an injection of a carbon and silicon rich, organosilane precursor. The stoichiometry and structure of the SiC film can be controlled by the choice of organosilane precursors and processing conditions. SiC films are preferably deposited by PECVD, in which organosilane ions help to form the SiC film for geometries approaching 0.1 micron or less. The inert gas ions available in the PECVD processing of SiC also can help to create a denser SiC film by sputtering some carbon material out of the SiC during the deposition process. After the deposition, the SiC film can have a thickness of approximately 100–300 Angstroms.

Figure 1G:
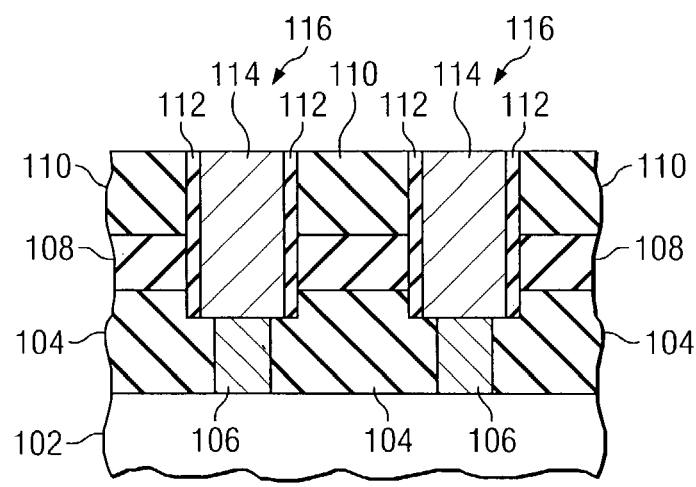

Referring now to FIG. 1g, the non-metal film 112 can be etched back to the upper surface of the LK film 110 and in the bottom portion of the trenches 111 to form interconnects 116. A highly uniform dry or plasma etch can be employed so that no stringers or other etch residuals are present. A plasma etchback of the non-metal film 112 can be suitable because the by-products of the plasma process are merely gaseous effluents. Alternative techniques include a wet or chemical etchback and a chemical mechanical polish (CMP).

A copper layer 114 can then be deposited over the exposed LK film 110 and over the trenches 111, including over any non-metal film 112 that may remain in the trench 111. Prior to the copper layer 114, a thin Ta layer can be deposited. The copper layer 114 can be formed by electroplating, CVD, PECVD, PVD, ALD, or any other method that is known by one who is skilled in the art. The copper layer 114 can also be formed by a combination of these processes, and therefore the final copper layer 114 may be formed from a copper seed deposited by CVD, ALD, PECVD or PVD and then a layer of electroplated copper, for example. In some embodiments, after the copper layer 114 has been formed, an upper portion of the copper layer may be etched or polished, as required.

Figure 2A:
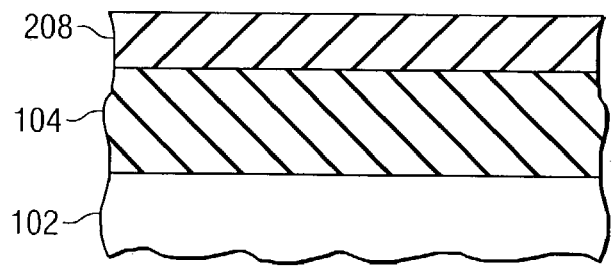
FIGS. 2a–2g are cross-sectional views of a copper damascene metallization method using a second embodiment of the present invention.

Referring now to FIGS. 2a–2g, a second fabrication method to create MBF copper damascene interconnects is disclosed. Referring first to FIG. 2a, the fabrication process can begin with one or more FEOL devices 102, which can include basic MOSFETs and/or other integrated circuits. These devices 102 are covered with a phosphosilicate glass (PSG) layer 104. The PSG 104 layer may also be another type of doped oxide, such as borophosphosilicate glass (BPSG) that can inhibit the penetration of sodium or other contaminates down to the FEOL devices 102 and can provide global planarization over the FEOL devices. The PSG or BPSG layer 104 can be formed CVD, PECVD, or any other method that is known by one who is skilled in the art.

Still referring to FIG. 2a, the PSG layer can be covered with a non-metal barrier layer 208 comprising a barrier material such as SiOC or SiCN. In this second embodiment, unlike the first embodiment, the non-metal barrier layer 208 is deposited before refractory metal plugs are formed which can improve barrier diffusion in the completed interconnect. Where SiOC is chosen as the barrier material for the non-metal barrier layer 208, the film thickness can be approximately 500 Angstroms, an increase of 100 Angstroms over the thickness of the non-metal barrier layer 108 of FIG. 1d. This increased thickness can also ultimately improve barrier diffusion in the completed interconnect. The non-metal barrier layer 208 can be formed by CVD, ALD, PECVD, PVD, or any other method that is known to those skilled in the art. Some metal and oxygen containing compounds may have suitable barrier properties, and can be used as the non-metal barrier layer 208. The non-metal barrier layer 208 deposition process may be implemented in a variety of process equipment reactors. The processing equipment can be performed in a cluster tool provided by equipment manufacturers such as Applied Materials, Inc. or Novellus Systems, Inc. Where, for example, the non-metal barrier layer 208 is chosen to be SiOC, the layer may be deposited in an ambient environment of 1 to 3 torr at a temperature of 350° C. to 400° C. Reactant gases and liquid precursor vapor may be injected into the process reactor to enable SiOC film growth and formation. The reactant gases may consist of He and/or CO2, and the precursor can be an organosilane precursor vapor. The organosilane precursor can be injected into the process reactor by many methods of injection such as liquid mass flow control, direct liquid injection, bubbling, or any other method that is known by one who is skilled in the art.

Figure 2B:
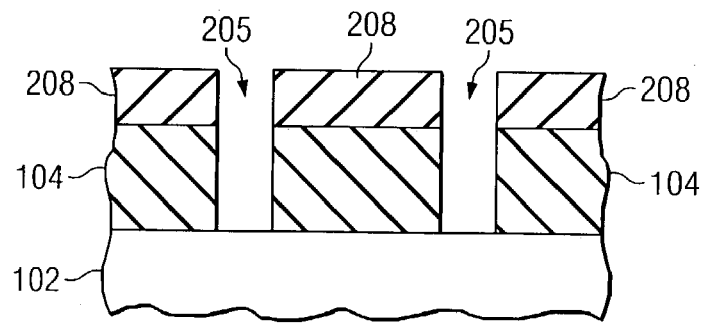

Referring now to FIG. 2b, one or more trenches 205 can be formed through the non-metal barrier layer 208 and the PSG layer 104 by a plasma etch or another fabrication method known to those skilled in the art. The trenches 205 can be lined with a metal barrier. A metal barrier can be comprised of a refractory metal such as Ti, TiN, Ta, TaN, or other appropriate barriers.

Figure 2C:
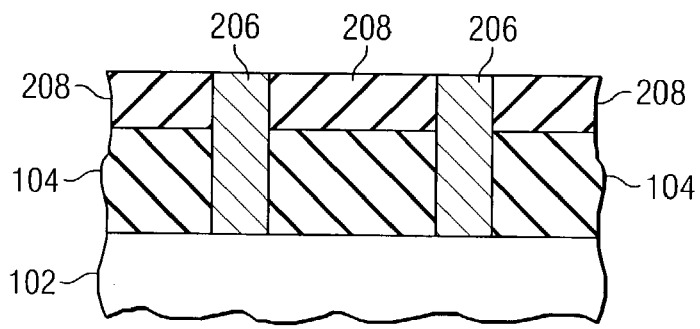

Referring now to FIG. 2c, the trenches 205 can be filled with a refractory metal film forming refractory metal plugs 206, such as tungsten plugs.

Figure 2D:
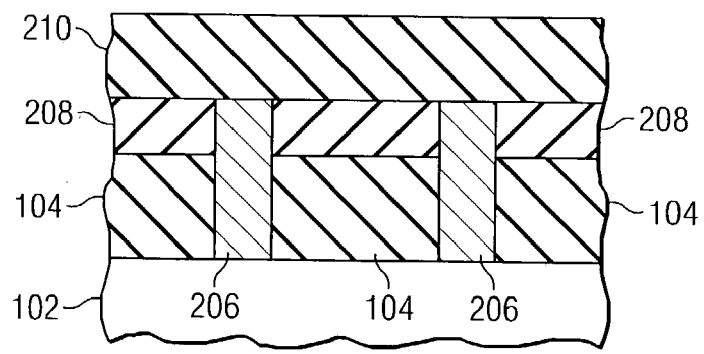

Referring now to FIG. 2d, an LK film 210 can be deposited over the non-metal barrier layer 208 and the refractory metal plugs 206. The LK film 210 can be a porous material with encapsulated vacuum bubbles or other low-k containing components in the film. The LK film 210 can be deposited by a spin-on application, CVD, PECVD, ALD, PVD, or any other method that is known by one who is skilled in the art. The LK film 210 can receive an anti-reflective coating (ARC). The LK film 210 can then be deposited with a patterned photoresist layer in preparation for the etching required to form interconnects for a forthcoming damascene metallization process.

Figure 2E:
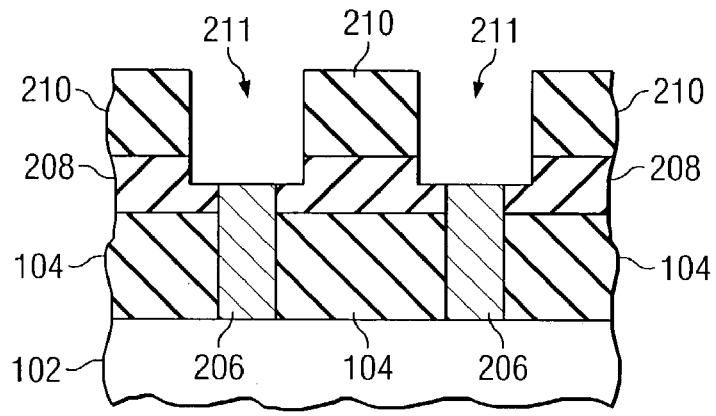

Referring now to FIG. 2e, the LK film 210 is then etched down through to the interface of the LK film 210 with the non-metal barrier layer 208 and the refractory metal plugs 206, creating trenches 211. The refractory metal plugs 206 and the non-metal barrier layer 208 create an etch stop which ensures that an adequate thickness of non-metal barrier layer 208 remains in contact with the refractory metal plugs 206. This remaining thickness of non-metal barrier layer 208 can thwart the diffusion of metal from the filled trenches 211 to the PSG layer 104 and the FEOL devices 102. The etch process can utilize a dry or plasma etch where reactant ions are accelerated towards the substrate with anisotropic velocity distributions to form vertical profiles through the LK film.

Figure 2F:
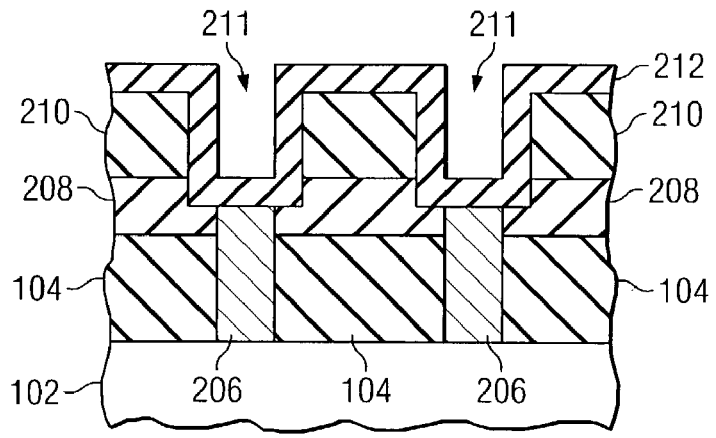

Referring now to FIG. 2f, the surface of the trenches 211 and the LK film 210 can receive a deposition of a non-metal film 212. The non-metal film 212 can be, for example, SiOC, SiC or SiCN. Additionally, some metal and oxygen containing compounds may have suitable barrier properties, and may be used as the non-metal film 212. Where SiC is chosen as the non-metal film 212, the SiC can be deposited by CVD, ALD, PECVD, PVD, or any other method that is known by one who is skilled in the art. The SiC film can be formed by using an injection of a carbon and silicon rich, organosilane precursor. The stoichiometry and structure of the SiC film can be controlled by the choice of organosilane precursors and processing conditions. SiC films are preferably deposited by PECVD, in which organosilane ions help to form the SiC film for geometries approaching 0.1 micron or less. The inert gas ions available in the PECVD processing of SiC also can help to create a denser SiC film by sputtering some carbon material out of the SiC during the deposition process. After the deposition, the SiC film can have a thickness of approximately 100–300 Angstroms.

Figure 2G:
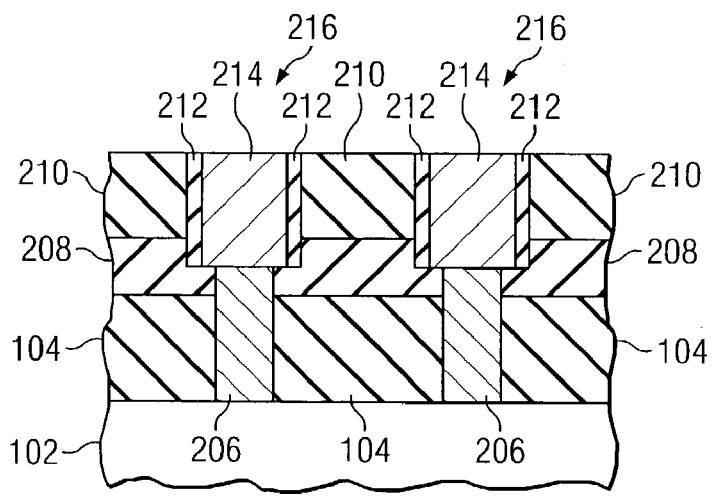

Referring now to FIG. 2g, the non-metal film 212 can be etched back to the upper surface of the LK film 210 and in the bottom portion of the trenches 211 to form interconnects 216. A highly uniform dry or plasma etch can be employed such that no stringers or other etch residuals are present. A plasma etchback of the non-metal film 212 is suitable because the by-products of the plasma process are merely gaseous effluents. Alternative techniques include a wet or chemical etchback and CMP.

A copper layer 214 can then be deposited over the exposed LK film 210 and over the trenches 211, including over any non-metal film 212 that may remain in the trench 211. Prior to the copper layer 214, a thin Ta layer can be deposited. The copper layer 214 can be formed by electroplating, ALD, CVD, PECVD, PVD, or any other method that is known by one who is skilled in the art. The copper layer 214 can also be formed by a combination of these processes, and therefore the final copper layer 214 may be formed from a copper seed deposited by CVD, PECVD, ALD or PVD and then a layer of electroplated copper, for example. In some embodiments, after the copper layer 114 has been formed, an upper portion of the copper layer may be etched or polished, as required.

In this embodiment, a thickness of non-metal barrier layer 208 surrounds the refractory metal plug 206 preventing the diffusion of the copper layer 214 into the PSG layer 104. Because the non-metal barrier layer 208 is fabricated to surround the refractory metal plugs 206, rather than covering them as non-metal barrier layer 108 covers refractory metal plugs 106 in FIG. 1d, the chance of copper diffusion is reduced. Additionally, the thickness of non-metal barrier layer 208 is at least 100 Angstroms greater than the thickness of non-metal barrier layer 108. Even if the non-metal film 212 is etched back such that it becomes insufficient to block copper diffusion, the non-metal barrier layer 208 can inhibit the diffusion of the copper layer 214 into the PSG layer 104 and even the FEOL devices 102.

Figure 3:
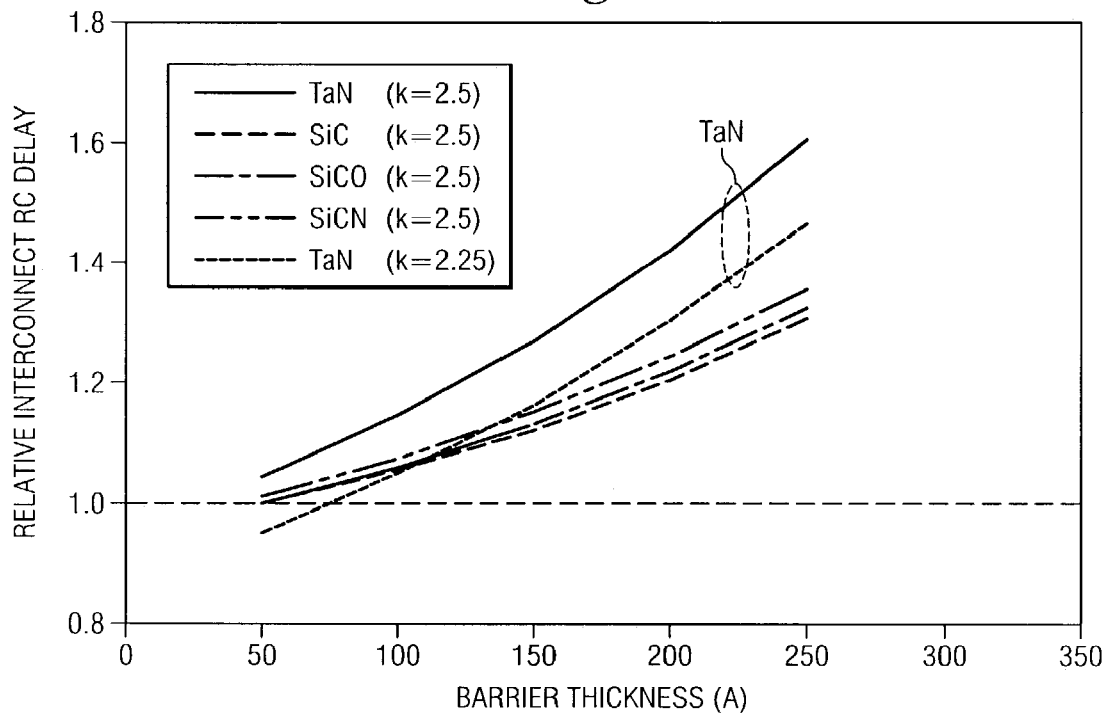
FIG. 3 is a chart showing relative interconnect RC delays for TaN and silicon carbide based barriers along copper lines.

Referring to FIG. 3, a chart 300 shows an RC delay simulation for copper dual damascene interconnects with TaN or SiC barriers. As the chart 300 indicates, SiC containing barriers and interlayer dielectrics can provide superior reliability and performance compared to refractory metal barriers. Although the interconnect RC delay rises with the increasing thickness of either metal or the silicon carbide based dielectrics, the rate of RC increase is more rapid for the metal barrier. For a low k dielectric, e.g., with a k of 2.5, the RC delay is drastically reduced by replacing TaN with the silicon based dielectrics. This delay reduction becomes more pronounced as the barrier thickness increases.

Figure 4:
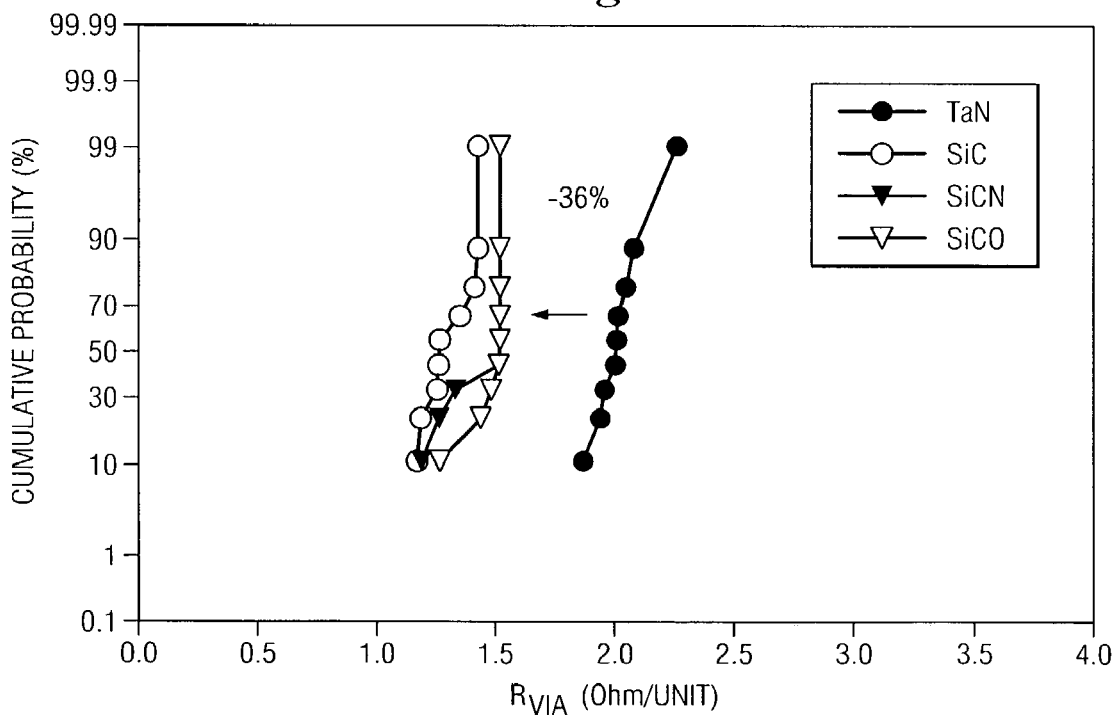
FIG. 4 is a chart showing distributions of trench resistance for the copper dual damascene interconnects with TaN and silicon carbide barriers.

Referring now to FIG. 4, a chart 400 shows that using a silicon carbide based dielectric such as SiC, SiCN, and SiCO instead of TaN improves the trench resistance of copper dual damascene interconnections. SiC can have an approximately 1.3 Ohm/unit trench resistance for a 0.14 um trench which can deliver a reduction in trench resistance of approximately 36% as compared to a metallized barrier such as TaN.

Figure 5:
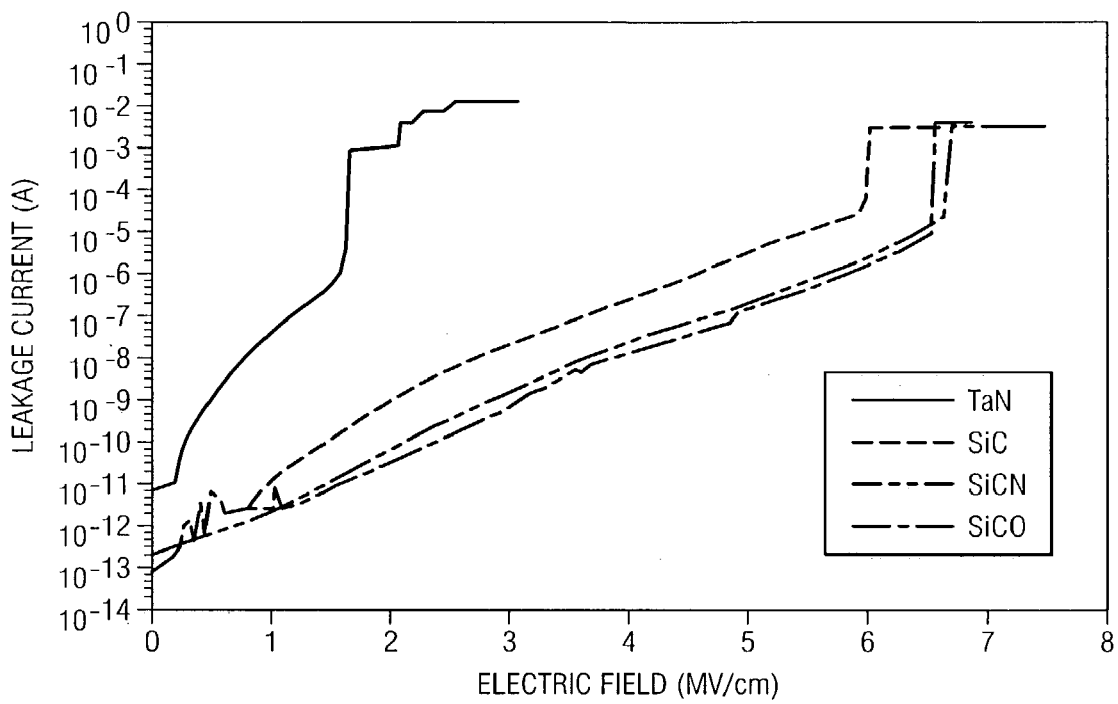
FIG. 5 is a chart showing line-to-line leakage current versus electric field measured at 200° C. for copper dual damascene interconnects with TaN or silicon carbide barriers.

Referring now to FIG. 5, another advantage of using silicon carbide based dielectrics over a metal such as TaN is an improvement in line to line leakage. As chart 500 shows, the line to line leakage of the silicon carbide copper dual damascene interconnects can be dramatically reduced by approximately three orders of magnitude at a temperature of 200 C.

Figure 6:
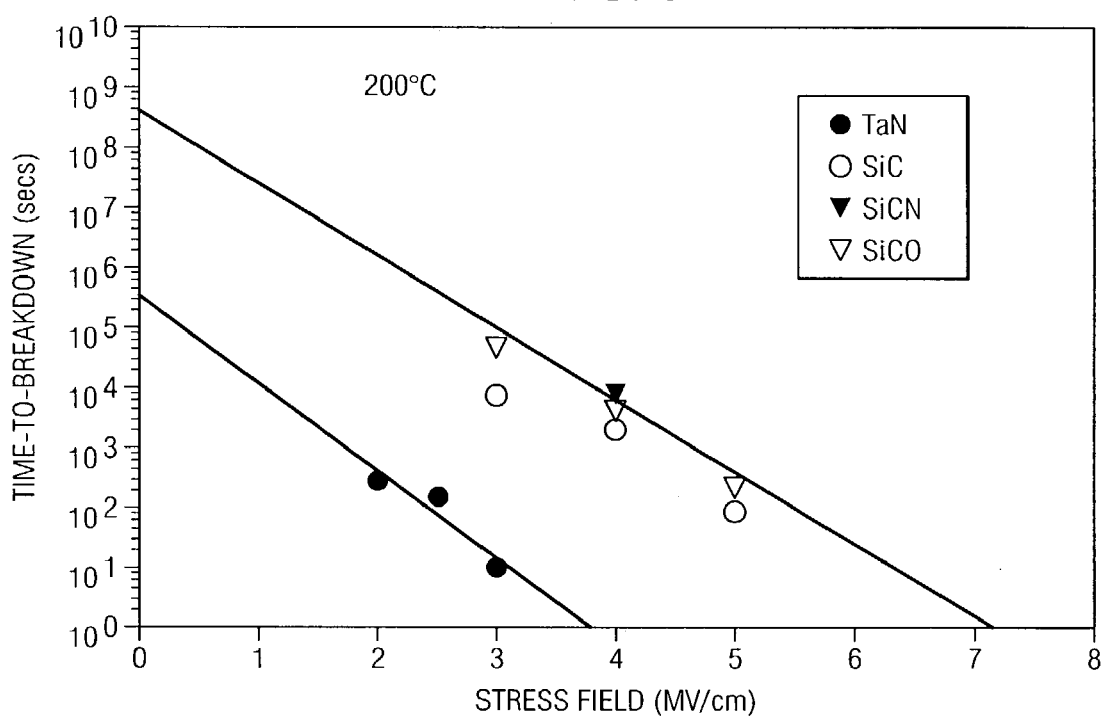
FIG. 6 is a chart of TDDB versus bias-temperature stress (BTS) fields at 200° C. for copper dual damascene interconnects with TaN and silicon carbide barriers.

Referring now to FIG. 6, another advantage of using silicon carbide based dielectrics over a metal such as TaN is an improvement in copper TDDB lifetime. Chart 600 shows that the TDDB lifetimes for TaN are approximately three orders of magnitude smaller than the silicon carbide based dielectrics at 200 C. Both FIGS. 5 and 6 demonstrate that silicon carbine containing barrier are much more resistant to Cu leakage than metal based barriers.

The present invention has been described relative to a preferred embodiment. Improvements or modifications that become apparent to persons of ordinary skill in the art only after reading this disclosure are deemed within the spirit and scope of the application. The present invention may be applied and implemented on a variety of surfaces that may be of any shape planar, curved, spherical, or three-dimensional. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An integrated circuit comprising:
   one or more front end of line devices;
   a layer of doped oxide overlying the one or more front end of line devices;
   a plurality of refractory metal plugs in the doped oxide layer;
   a first barrier layer of silicon oxycarbide (SiOC) in contact with and directly overlying the layer of doped oxide and the plurality of refractory metal plugs;
   a low dielectric constant film in contact with and directly overlying the first barrier layer;
   wherein the low dielectric constant film and the first barrier layer include a plurality of metal-filled trenches etched there-through to provide a metal plug extending from the top of the low dielectric constant film to at least one of the plurality of refractory metal plugs; and
   a non-metal film positioned between the metal plug and the low dielectric constant film and between the metal plug and the first barrier layer, wherein an upper surface of the non-metal film is coplanar with an upper surface of the low dielectric constant film.

2. The integrated circuit of claim 1 wherein the first barrier layer has a thickness greater than 400 Å.

3. The integrated circuit of claim 1 wherein the first barrier material has a thickness of approximately 400–600 Å.

4. The integrated circuit of claim 1 wherein the metal plug is filled via a damascene process.

5. The integrated circuit of claim 1 wherein the non-metal film is one of either SiC, SiOC, or SiCN.

6. The integrated circuit of claim 1 wherein a thickness for the non-metal film is between approximately 100 and 300 Angstroms.

7. An interconnect for electrically connecting one or more front end of line devices to other structures of an integrated circuit, the interconnect comprising:
   a layer of doped oxide overlying at least one of the one or more front end of line devices;
   a refractory metal plug in the doped oxide layer;
   a first barrier layer in contact with and directly overlying the layer of doped oxide and the refractory metal plug, the first barrier layer including silicon and carbon, and having a thickness greater than 400 Å;
   a low dielectric constant film over the first barrier layer;
   wherein the low dielectric constant film and the first barrier layer include a metal-filled trench etched there-through to provide a metal plug extending from the top of the first barrier layer to at least one of the plurality of refractory metal plugs; and
   a non-metal film positioned between the metal plug and the low dielectric constant film and between the metal plug and the first barrier layer, wherein an upper surface of the non-metal film is coplanar with an upper surface of the low dielectric constant film.

8. An interconnect for electrically connecting a front end of line device to another structure of an integrated circuit, the interconnect comprising:
   a doped oxide layer overlying the front end of line device;
   a first barrier layer containing silicon and carbon directly overlying the doped oxide layer;
   a refractory metal plug having a lower portion positioned within the doped oxide layer and an upper portion positioned within the first barrier layer, wherein the upper portion includes an upper surface that is lower than the upper surface of the first barrier layer and not covered by the first barrier layer; and
   a low dielectric constant film overlying the first barrier layer, wherein a conductive material extends through an opening in the low dielectric constant film and the first barrier layer to contact the upper surface of the refractory metal plug;
   a non-metal barrier layer positioned in the opening between the conductive material and the low dielectric constant film and between the conductive material and the first barrier layer, wherein an upper surface of the non-metal barrier layer is coplanar with an upper surface of the low dielectric constant film.

* * * * *